United States Patent [19]
Sechi

[11] 4,091,334
[45] May 23, 1978

[54] CONNECTION OF A PLURALITY OF DEVICES TO A CIRCULAR WAVEGUIDE

[75] Inventor: Franco Nicola Sechi, Lawrenceville, N.J.

[73] Assignee: RCA Corporation, New York, N.Y.

[21] Appl. No.: 810,737

[22] Filed: Jun. 28, 1977

[51] Int. Cl.² ............................ H03F 3/10; H01P 5/12
[52] U.S. Cl. ...................................... 330/287; 330/53; 330/286; 333/9; 333/21 R
[58] Field of Search .......................... 330/53, 286, 287; 333/6, 9, 21 R

[56] References Cited

U.S. PATENT DOCUMENTS

| | | | |
|---|---|---|---|
| 3,020,495 | 2/1962 | Miller | 333/21 R X |
| 3,096,474 | 7/1963 | Marie | 333/21 R X |

Primary Examiner—Lawrence J. Dahl
Attorney, Agent, or Firm—Leonard Weiss; Joseph D. Lazar; H. Christofffersen

[57] ABSTRACT

A hollow cylinder that has a permittivity greater than the permittivity of air is coaxially disposed within a waveguide with the proximal end of the cylinder coplanar with one end of the waveguide. The cylinder has a metal clad surface wherein a plurality of tapered slots that are narrowest at the proximal end of the cylinder and widest at the distal end thereof. The slots are coupled to respective amplification devices, thereby causing the waveguide to be terminated in an impedance substantially equal to impedances of the devices connected in series. Microwave power is transmitted through the waveguide via propagation of a wave in the $TE_{01}$ mode. When the wave propagates to the cylinder, the power is transmitted to the devices via the electric fields within the slots at the proximal end of the cylinder. The wave propagates from the cylinder in response to the power being provided by the devices.

11 Claims, 7 Drawing Figures

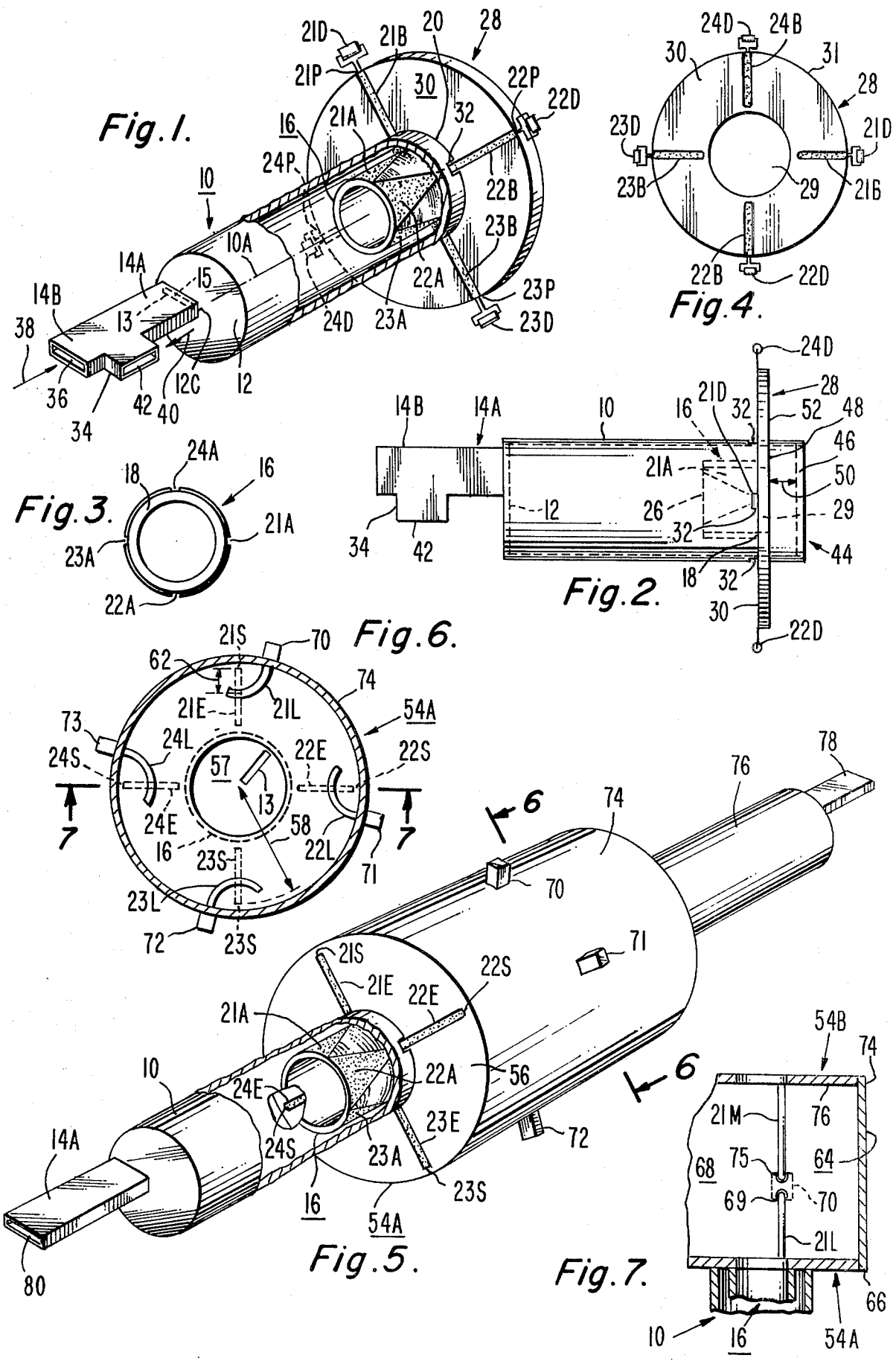

CONNECTION OF A PLURALITY OF DEVICES TO A CIRCULAR WAVEGUIDE

BACKGROUND OF THE INVENTION

1. Field of the Invention

This invention relates to guiding waves of electromagnetic energy and more particularly to guiding energy associated with a wave from a single signal source to a plurality of loads and from a plurality of signal sources to a single load.

2. Description of the Prior Art

An amplification device is usually incapable of providing a high power level to a load at microwave frequencies. A plurality of similar devices are typically connected in parallel whereby each of the plurality of devices provides a portion of the power to the load.

One well known type of single port device is a diode, such as either the Gunn or IMPATT type, or a pumped varactor, which has a negative resistance characteristic. A plurality of the diodes are typically included in what is known as a reflection amplifier. Because of the negative resistance, when input power is provided to the reflection amplifier, there is a reflection therefrom of output power that exceeds the input power. The reflection amplifier has a power gain that is a maximum when the negative resistance of the reflection amplifier has an amplitude that approximately matches the amplitude of the characteristic impedance of a transmission line, such as a waveguide, that couples power to and from the reflection amplifier.

The amplitude of the impedance of the diode typically is low in comparison with the characteristic impedance. Because the reflection amplifier includes a plurality of diodes that are connected in parallel, the reflection amplifier has an impedance with an amplitude that is much lower than the amplitude of the characteristic impedance. Accordingly, there is usually a severe mismatch between the impedance of the reflection amplifier and the characteristic impedance. Hence, there is a need for a reflection amplifier that has an impedance with an amplitude which is easily matched to a waveguide.

Similarly, another well known type of device, a transistor, has input and output impedances that are low in comparison with the characteristic impedance. A power amplifier usually includes a plurality of transistors connected in parallel.

Therefore, the power amplifier has input and output impedances that are much lower than the characteristic impedance. Accordingly, there is usually a severe mismatch between the input and output impedance of the power amplifier and the characteristic impedance.

An impedance mismatch is obviated by coupling an amplification device to the waveguide through an impedance transformation device. The transformation device has a bandwidth that is inversely related to a ratio (called an impedance transformation ratio) of the characteristic impedance to the impedance of the amplification device. Therefore, the transformation device introduces a substantial limitation on the bandwidth of power transmitted therethrough. Hence, there is a need for a power amplifier that can be used without introducing such a bandwidth limitation.

SUMMARY OF THE INVENTION

According to the present invention, a hollow cylinder that has a permittivity greater than the permittivity of air is coaxially disposed within a cylindrical waveguide with the proximal end of the cylinder near an end of the waveguide. The cylinder has a surface clad with an electrically conductive material wherein a plurality of electrically non-conductive slots are relatively wide and relatively narrow at the proximal and the distal ends, respectively, of the cylinder. Electric fields within at least two of the slots at the proximal end of the cylinder are each coupled to an amplification device. Power is transmitted through the waveguide via propagation of a wave of electromagnetic energy in a $TE_{01}$ mode. When the wave propagates to the cylinder, a portion of the power is transmitted to each of the amplification devices via the slots. Power provided by the amplification devices causes the wave to propagate from the cylinder.

BRIEF DESCRIPTION OF THE DRAWING

FIG. 1 is a perspective view with a part broken away of a first embodiment of the present invention;

FIG. 2 is a plan view of the embodiment of FIG. 1;

FIG. 3 is an end view of a metal clad dielectric cylinder of the embodiment of FIG. 1;

FIG. 4 is a plan view of a metal clad surface of a dielectric disc of the embodiment of FIG. 1;

FIG. 5 is a perspective view of a second embodiment of the present invention;

FIG. 6 is a view taken along the line 6—6 of FIG. 5; and

FIG. 7 is a fragmentary view taken along the line 7—7 of FIG. 6.

DESCRIPTION OF THE PREFERRED EMBODIMENT

As shown in FIGS. 1 and 2, a reflection amplifier is comprised of a cylindrical waveguide 10 that has an axis 10A and a disc shaped end wall 12 with a slot 13 therethrough. Slot 13 extends substantially radially from the center 12C of end wall 12. As explained hereinafter, the reflection amplifier includes four IMPATT diodes. Waveguide 10 is terminated by an impedance substantially equal to the impedances of the diodes connected in series.

End wall 12 is perpendicularly connected to a waveguide 14A at a port 15 thereof. Port 15 is in contiguous register with slot 13 whereby a passageway is provided between waveguides 10 and 14A.

Because slot 13 extends radially, when an electromagnetic wave of input energy propagates in a $TE_{10}$ mode (referred to as a linearly polarized input wave) through waveguide 14A to waveguide 10, an input wave propagates in a $TE_{01}$ mode (referred to as a circular input wave) from end wall 12 through waveguide 10. Conversely, when an electromagnetic wave of output energy propagates in the $TE_{01}$ mode through waveguide 10 towards waveguide 14A, an output wave propagates in the $TE_{10}$ mode through waveguide 14A away from waveguide 10. Input and output microwave power of the reflection amplifier are transmitted via the input and output waves, respectively.

It is well known that in waveguide 10, the propagation in the $TE_{01}$ mode is associated with an electric field therein that is different from zero only in a tangential direction. The field has a strength in accordance with a relationship which is given as:

$$E_\phi = j\sqrt{\frac{\mu}{\epsilon}}\ \frac{f}{f_c}\ BJ'o\,(K_c r) \quad (1)$$

where $E_\phi$ is the strength of the field at a known radial displacement from axis 10A;

$$K_c = \frac{P'_{01}}{x}$$

$\mu$ is the permeability of air;

$\epsilon$ is the permittivity of air;

$f_c$ is the lower out-off frequency of waveguide 10;

$B$ is the magnetic flux density within waveguide 10;

$r$ is the radius of the interior of waveguide 10;

$x$ is the known radial displacement;

$J'o\,(K_c r)$ is the first derivative of the zero order Bessel function of the argument, $K_c r$; and $P'_{01}$ is the first root of $J'o\,(K_c r)$, and equals 3.83.

According to the relationship (1), the field strength, $E_\phi$, is a maximum when the known radial displacement, $x$, is 0.469$r$. Therefore, when a dielectric material, with a permittivity greater than the permittivity of air, is disposed at the radial displacement of 0.469$r$, the dielectric material is optimally disposed for concentrating therein an input field associated with the circularly polarized input wave.

In this embodiment, a hollow cylinder 16, made from the dielectric material, is used for concentrating the input field. The wall of cylinder 16 has a mean radius equal to 0.469$r$, and a thickness approximately equal to one tenth of the mean radius.

Cylinder 16 is coaxially disposed within waveguide 10 with a proximal end 18 of cylinder 16 coplanar with an end 20 of waveguide 10 (FIGS. 2 and 3). Because of the mean radius, cylinder 16 is optimally disposed for concentrating therein the input field when the circular input wave propagates to cylinder 16. The disposition of cylinder 16 is maintained within waveguide 10 in a manner described hereinafter.

Cylinder 16 has a metal clad outer surface with similar electrically non-conducting tapered slots 21A-24A therein that are narrowest at proximal end 18 and widest at the distal end 26 of cylinder 16. Since cylinder 16 is made from the dielectric material, the metal clad outer surface of cylinder 16 causes four approximately equal portions of the input field to propagate to slots 21A-14A, respectively, and become concentrated therein.

It is well known that the product of the distance across any of slots 21A-24A and the peak field strength therebetween (referred to as a field strength-distance product) is a constant. Since slots 21A-24A are narrowest at proximal end 18, the field strengths within slots 21A-24A is a maximum at proximal end 18. Accordingly, when the narrowest ends of slots 21A-24A are each connected to the input of an amplification device, the maximum field strengths within slots 21A-24A are coupled to the inputs of the amplification devices. In this embodiment, the narrowest ends of slots 21A-24A are connected through a disc 28 to IMPATT diodes in a manner explained hereinafter. An alternative embodiment may provide a coupling of the input field to either Gunn diodes or pumped varactors.

Disc 28 (FIG. 4) has a circular central hole 29 therethrough with a radius substantially equal to the radius of the interior surface of cylinder 16. Moreover, disc 28, similar to cylinder 16, is made from the dielectric material, a surface 30 of disc 28 being clad with metal. Disc 28 has a radius that is greater than the radius of the exterior of waveguide 10 whereby a part of surface 30 is exterior to waveguide 10.

As shown in FIG. 4, surface 30 has radial non-conductive slots 21B-24B that extend to the outer edge of disc 28. Slots 21B-24B have equal arcuate spacing therebetween, widths of slots 21B-24B being substantially equal to the narrowest widths of slots 21A-24A (at proximal end 18).

Surface 30 is connected to ends 20 and 18 in a manner that fixedly maintains disc 28 and cylinder 16 coaxial within waveguide 10. The connection of surface 30 causes slots 21B-24B to be contiguous and in register with slots 21A-24A, respectively. Waveguide 10 has clearance holes 32 that provides passageways for slots 21B-24B through waveguide 10. As known to those skilled in the art, slots 21A and 21B form a slot line (referred to as reflection amplifier slot line hereinafter). Similarly, slots 22A-24A and slots 22B-24B form three reflection amplifier slot lines.

Slots 21B-24B are respectively connected to coaxial probes 21P-24P. External to disc 28, probes 21P-24P are connected to IMPATT diodes 21D-24D, respectively, whereby waveguide 10 is connected via the reflection amplifier slot lines and probes 21P-24P to diodes 21D-24D. Accordingly, the four portions of the input field and, therefore, the circular input wave, are coupled to diodes 21D-24D, respectively, whereby a portion of the input power of the reflection amplifier is transmitted to each of diodes 21D-24D. Hence, the input power of the reflection amplifier is divided into four portions.

In response to the input field, diodes 21D-24D respectively produce four approximately equal portions of a reflected field. Because IMPATT diodes 21D-24D are negative resistance devices, the reflected field has a larger amplitude than the input field.

The four portions of the reflected field propagate through the reflection amplifier slot lines in a direction opposite from the direction of propagation of the four portions of the input field. Since slot lines and waveguides are linear, bilateral circuit elements, the four portions of the reflected field are combined in waveguide 10, thereby providing the circular output wave (which is propagated through waveguide 10 to end wall 12). Therefore, the power (transmitted via the circular output wave) from diodes 21D-24D is combined.

The combined power from diodes 21D-24D is substantially the output power of the reflection amplifier. The output power of the reflection amplifier exceeds the input power thereof because the amplitude of the reflected field is larger than the amplitude of the input field.

Since cylinder 16 is coaxial with waveguide 10 and because of the coupling provided by the reflection amplifier slot lines, waveguide 10 is terminated by an impedance substantially equal to the impedances of diodes 21D-24D connected in series. An alternative embodiment may include any desired number of slot lines and diodes.

Preferably, the sum of the amplitudes of the impedances of diodes 21D-24D approximately matches the amplitude of the characteristic impedance of waveguide 10. A mismatch of the amplitudes of the impedances may be compensated by an impedance transformation device (not shown) of any suitable type. It should be appreciated that the transformation device has a transformation ratio less than transformation ratios used in a reflection amplifier of the prior art that includes four IMPATT diodes.

The output power of the reflection amplifier is provided, as explained hereinafter, by a circulator 34 of any suitable type fixedly connected between waveguide 14A and a rectangular waveguide 14B which is similar to waveguide 14A. Waveguide 14B has an input port 36 where the linearly polarized input wave may be launched.

A launched linearly polarized input wave propagates in the direction of an arrow 38 through circulator 34 to waveguide 10, thereby causing the propagation of the circular input wave as described hereinbefore. Moreover, the linearly polarized output wave propagates from end wall 12 in the direction of an arrow 40 through circulator 34 to an output port 42 thereof. The output power of the reflection amplifier is provided to any suitable load (not shown) that is connected to port 42. Circulator 34 is of a type well known in the art.

Preferably, the reflection amplifier includes a terminating section 44 (FIG. 2) that has the shape of a cylinder with a closed end 46 and an open end 48. Ends 46 and 48 are separated by a distance 50, which is the axial length of the interior of section 44. Distance 50 approximately equals one quarter of a wavelength of the waves that propagate through waveguide 10. Section 44 has an interior cylindrical surface with a radius approximately equal to the radius of the interior surface of waveguide 10.

End 48 is connected to a surface 52 of disc 28 in a manner that maintains section 44 coaxial with waveguide 10. Because distance 50 is one quarter of a wavelength, when a wave of electromagnetic energy propagates from waveguide 10 through hole 29, it is reflected from end 46 back through hole 29 whereby the field associated with the reflected wave may be concentrated within cylinder 16.

A second embodiment (FIGS. 5–7) of the present invention is a transistor amplifier where power transmitted via the circular input wave is divided into four portions. The four portions are each amplified by one of four transistor amplifier stages. Amplified power from the amplifier stages is combined and applied to a load.

As shown in FIGS. 5–7, waveguide 10 and cylinder 16 are connected to a disc 54A (FIG. 5) at a surface 56 thereof. Disc 54A has a radius greater than the radius of the exterior surface of waveguide 10. Additionally, disc 54A has a central hole therethrough, similar to hole 29 (FIG. 4). As explained hereinafter, waveguide 10 is terminated by an impedance substantially equal to the input impedances of the amplifier stages connected in series.

Disc 54A, similar to cylinder 16, is made from the dielectric material, surface 56 being clad with metal. Surface 56 has radial non-conductive slots 21E–24E with equal arcuate spacing therebetween. Additionally, slots 21E–24E have widths substantially equal to the narrowest widths of slots 21A–24A (at proximal end 18).

Unlike slots 21B–24B, slots 21E–24E have distal ends 21S–24S (FIG. 6), respectively, that are a distance 58 from the center of disc 54A. Since surface 56 is metal clad, ends 21S–24S are short circuit terminations of slots 21E–24E, respectively, thereby causing a wave of electromagnetic energy that propagates to distal ends 21S–24S, to be reflected therefrom. The reflection causes the electric field within slots 21E–24E to have a maximum amplitude one fourth of a wavelength from distal ends 21S–24S, respectively.

The connection of waveguide 10 and cylinder 16 to disc 54A is similar to their connection to disc 28 described hereinbefore, whereby slots 21E–24E are contiguous and in register with slots 21B–24B, respectively. Therefore, slots 21B and 21E form a slot line (referred to as transistor amplifier slot line hereinafter). Similarly, slots 22B–24B and slots 22E–24E form three transistor amplifier slot lines.

The four portions of the input field propagate through the transistor amplifier slot lines in a manner similar to the propagation of the input field through the reflection amplifier slot lines. Therefore, a portion of the input power of the transistor amplifier is transmitted through each of slots 21E–24E. The input power of the transistor amplifier is extracted from slots 21E–24E by microstrip lines 21L–24L that are connected to a surface 60 of disc 54A.

Line 21L passes substantially perpendicularly to slot 21E as shown in FIG. 6. Moreover, the center of line 21L and distal end 21S are separated by a distance 62 that substantially equals one quarter of a wavelength. Because of the spatial relationship of line 21L to slot 21E, energy that propagates towards line 21L is extracted by line 21L. Additionally, because of distance 62, energy that propagates towards end 21S and is reflected therefrom is extracted by line 21L. Hence, line 21L has an optimal spatial relationship to slot 21E for extracting the portion of the input power transmitted through slot 21E. Similarly, lines 22L–24L have optimal spatial relationships to slots 22E–24E for extracting portions of the input power transmitted through slots 22E–24E.

Disc 54A is coaxially mounted within a metal cylinder 64 near an end 66 thereof (FIG. 7). The radius of disc 54A and the radius of the exterior of cylinder 64 are substantially equal, whereby the edge of the disc 54A abuts an interior surface 68 of cylinder 64.

Line 21L extends within cylinder 64 parallel to the axis thereof along surface 68 to a feedthrough connector 69 of any suitable type. Feedthrough 69 extends from the interior to the exterior of cylinder 64 and provides an electrical connection therebetween.

Line 21L is connected via feedthrough 69 to the input of a transistor amplifier stage 70 mounted on an exterior surface 74 of cylinder 64. Therefore, the portion of the input power transmitted through slot 21E is transmitted to the input of amplifier stage 70 through line 21L.

In similar manner, lines 22L–24L are connected to the inputs of transistor amplifier stages 71–73, respectively, whereby portions of the input power are transmitted thereto. For reasons given in connection with the first embodiment, waveguide 10 is terminated by an impedance substantially equal to the input impedances of amplifier stages 70–73 connected in series.

As shown in FIG. 7, the output of amplifier stage 70 is connected to a microstrip line 21M (similar to line 21L) via a feedthrough connector 75 (similar to feedthrough 69) thereby causing amplified power from amplifier 70 to be transmitted through line 21M.

Line 21M extends within cylinder 64 parallel to the axis thereof along surface 68 to a disc 54B that is similar to disc 54A. Additionally, line 21M is positioned on a surface 76 (similar to surface 60 of FIG. 6) of disc 54B to have a spatial relationship to a slot within disc 54B similar to the spatial relationship of line 21L to slot 21E described hereinbefore. In a similar manner to amplifier stage 70, output power from amplifier stages 71–73 is transmitted through microstrip lines (similar to lines 22L–24L) to disc 54B.

Disc 54B is connected to a waveguide 76 and a cylinder (not shown) that are similar to waveguide 10 and cylinder 16, respectively, the connection being similar to the connection of disc 54A to waveguide 10 and cylinder 16. Additionally, a waveguide 78, similar to waveguide 14A is connected to waveguide 76 in a manner similar to the connection of waveguide 14A to waveguide 10. for reasons given in connection with the first embodiment, waveguide 78 is terminated by an impedance equal to the output impedances of amplifier stages 70–73 connected in series.

In this embodiment, the linearly polarized input wave is launched at a port 80 of waveguide 14A thereby causing the input power to be transmitted through lines 21M–24M. Since waveguide 76, the cylinder therein, and the transistor amplifier slot lines are all linear bilateral circuit elements, the circular output wave is propagated through waveguide 76 in a direction away from disc 54B (similar to the propagation of the circular output wave in the first embodiment). In response to the circular output wave, the linearly polarized output wave propagates through waveguide 78 to a port thereof that corresponds to port 80 of waveguide 14A.

What is claimed is:

1. Microwave apparatus comprising:
   a cylindrical waveguide wherein microwave energy is transmitted via propagation of a circular wave in a $TE_{01}$ mode;
   a hollow cylinder made from a material with a permittivity greater than the permittivity of air, a surface of said cylinder being clad with an electrically conductive material that has a first and a second electrically non-conductive tapered slot, said slots being relatively wide at the distal end of said cylinder and relatively narrow at the proximal end thereof, the radius of the exterior surface of said cylinder being less than the radius of the interior surface of said waveguide; and
   means connected to said waveguide and said cylinder for coaxially maintaining said cylinder within said waveguide with said proximal end adjacent to an end of said waveguide, whereby a propagation of the circular wave through said waveguide to said cylinder causes a portion of said energy to be provided by each of said slots at the proximal end of said cylinder.

2. Microwave apparatus of claim 1 wherein said cylinder has a mean radius substantially equal to 0.467 times the radius of the interior of said waveguide.

3. Microwave apparatus of claim 1 wherein said means for coaxially maintaining includes means adapted for coupling an electric field within said first and second tapered slots at the proximal end of said cylinder to a first and a second amplification device, respectively.

4. Microwave apparatus of claim 3 wherein said means for coaxially maintaining comprises a disc with a radius larger than the largest radial dimension of said waveguide, said disc being made from a material having a permittivity greater than the permittivity of air, a surface of said disc being clad with an electrically conductive material that has a first and a second radial electrically non-conductive slot, said disc being coaxially connected to said waveguide and to said cylinder with the first and second tapered slots respectively contiguous with the first and second radial slots, said first and second radial slots being adapted for connection to said first and second amplification devices, respectively.

5. Microwave apparatus of claim 4, wherein said disc has a central hole therethrough, additionally comprising a hollow cylindrical waveguide termination section which is closed at one end, said termination section having an axial length substantially equal to one fourth of a wavelength of a wave of electromagnetic energy propagated through said waveguide, the radius of the interior surface of said termination section being substantially equal to the radius of the interior surface of said waveguide, said open end being connected to the unclad surface of said disc with said termination section coaxial with said waveguide.

6. Microwave apparatus of claim 1 additionally comprising:
   a first diode of a negative resistance type;
   a second diode of said negative resistance type; and
   means for respectively coupling said first and second diodes to an electric field within said first and second tapered slots at the proximal end of said cylinder.

7. Microwave apparatus of claim 1 wherein the proximal end of said cylinder is coplanar with an end of said waveguide.

8. A microwave amplifier comprising:
   a first amplifier stage;
   a second amplifier stage;
   a pair of cylindrical waveguides;
   a pair of hollow cylinders made from a material with a permittivity greater than the permittivity of air, one surface of each of said cylinders being clad with an electrically conductive material that has a first and a second electrically non-conductive tapered slot therein, said tapered slots being relatively wide at the distal ends of said high permittivity cylinders and relatively narrow at the proximal ends thereof, the radius of the exterior surface of said high permittivity cylinders being less than the radius of the interior surface of said waveguides; and
   means for coaxially maintaining one of said high permittivity cylinders within one of said waveguides and the other of said high permittivity cylinders within the other of said waveguides, an end of each of said waveguides being adjacent to the proximal end of the high permittivity cylinder therein, said means including means for respectively coupling inputs of said first and second amplifier stages to an electric field within the first and second tapered slots at the proximal end of one of said high permittivity cylinders and for respectively coupling outputs of said amplifier stages to an electric field within the first and second tapered slots at the proximal end of the other of said high permittivity cylinders.

9. The amplifier of claim 8 wherein said maintaining means comprises:
   a pair of discs with a radius larger than the largest radial dimension of said waveguides, said discs being made from a material having a permittivity greater than the permittivity of air, one surface of each of said discs being clad with an electrically conductive material that has a first and second radial electrically non-conductive slot, one of said discs being connected coaxially to one of said waveguides and the other of said discs being connected coaxially to the other of said waveguides with the tapered slots of each waveguide contiguous with the slots of the disc connected thereto;

a hollow metal cylinder whereon said amplifier stages are mounted, the radius of the interior of said metal cylinder being substantially equal to the radius of said discs, one of said discs being fixedly disposed axially within said metal cylinder adjacent to one end thereof, the other of said discs being fixedly disposed axially within said metal cylinder adjacent to the other end thereof; and means for respectively connecting the input of said first and second amplifier stages to the first and second radial slots of one of said high permittivity cylinders and for respectively coupling the outputs of said first and second amplifier stages to the first and second radial slots of the other of said high permittivity cylinders.

10. The amplifier of claim 8 wherein said high permittivity cylinders have a mean radius substantially equal to 0.467 times the inside radius of said waveguides.

11. The amplifier of claim 8 wherein the proximal ends of the high permittivity cylinders are each coplanar with the end of the waveguide adjacent thereto.

* * * * *